(12) United States Patent
Kuo

(10) Patent No.: US 10,627,870 B2
(45) Date of Patent: Apr. 21, 2020

(54) SUPPORT FRAME FOR PORTABLE ELECTRONIC DEVICE

(71) Applicant: ONED CO., LTD., Haulien County (TW)

(72) Inventor: Chih Ju Kuo, Hualien County (TW)

(73) Assignee: Oned Co., Ltd., Hualien County (TW)

( * ) Notice: Subject to any disclaimer, the term of this patent is extended or adjusted under 35 U.S.C. 154(b) by 241 days.

(21) Appl. No.: 15/953,630

(22) Filed: Apr. 16, 2018

(65) Prior Publication Data
US 2018/0299923 A1 Oct. 18, 2018

(30) Foreign Application Priority Data

Apr. 17, 2017 (TW) .............................. 106205321 U

(51) Int. Cl.
G06F 1/16 (2006.01)
H05K 5/02 (2006.01)
F16M 11/20 (2006.01)
F16M 13/02 (2006.01)
F16M 13/00 (2006.01)
A47B 23/04 (2006.01)
(Continued)

(52) U.S. Cl.
CPC ............ *G06F 1/166* (2013.01); *A47B 23/042* (2013.01); *A47B 23/043* (2013.01); *F16M 11/041* (2013.01); *F16M 11/2021* (2013.01); *F16M 11/38* (2013.01); *F16M 13/00* (2013.01); *F16M 13/022* (2013.01); *G06F 1/1615* (2013.01); *G06F 1/1656* (2013.01); *H05K 5/0234* (2013.01)

(58) Field of Classification Search
CPC ...... G06F 1/166; G06F 1/1615; G06F 1/1656; A47B 23/042; F16M 11/043; F16M 11/041; F16M 11/2021; F16M 11/38; F16M 13/00; F16M 13/022; H05K 5/0234
USPC ....... 248/919, 920, 921, 922, 923, 917, 447, 248/455, 456, 457, 460, 463, 464, 465; 40/448, 754, 756, 753, 747; 361/679.27
See application file for complete search history.

(56) References Cited

U.S. PATENT DOCUMENTS

| 588,636 A | * | 8/1897 | Engstrom | A47B 97/08 248/465 |
| 3,370,821 A | * | 2/1968 | Mingis | A47B 97/04 248/452 |

(Continued)

Primary Examiner — Kimberly T Wood
(74) Attorney, Agent, or Firm — Rosenberg, Klein & Lee

(57) ABSTRACT

A support frame for a portable electronic device includes a frame body, a first support arm, and a second support arm. The first support arm includes a first casing plate and a first inner plate. The first casing plate is pivotally connected to the frame body. The first inner plate is movably accommodated in the first casing plate. The second support arm includes a second casing plate and a second inner plate. The second casing plate is pivotally connected to the frame body. The second inner plate is movably accommodated in the second casing plate. The first and second inner plates are pivotally connected to each other. The first and second inner plates are provided with multiple positioning portions, respectively. Each of the first and second casing plates is provided with a positioning member that can be positioned to one of the positioning portions of the corresponding inner plate.

3 Claims, 7 Drawing Sheets

(51) Int. Cl.
*F16M 11/38* (2006.01)
*F16M 11/04* (2006.01)

(56) References Cited

U.S. PATENT DOCUMENTS

| | | | | |
|---|---|---|---|---|
| 3,791,651 A * | 2/1974 | Barnum | ................. | A63F 1/10 273/150 |
| 4,452,234 A * | 6/1984 | Withjack | ................. | H02S 10/40 126/627 |
| 5,445,279 A * | 8/1995 | Warner | ................. | B62B 3/022 211/195 |
| 5,732,928 A * | 3/1998 | Chang | ................. | G06F 3/0208 248/688 |
| 6,016,248 A * | 1/2000 | Anzai | ................. | G06F 1/1626 361/679.59 |
| 6,431,511 B1 * | 8/2002 | Pfister | ................. | F16M 11/10 248/274.1 |
| 6,967,836 B2 * | 11/2005 | Huang | ................. | A45C 3/02 361/679.46 |
| 7,011,285 B2 * | 3/2006 | Wang | ................. | F16M 11/10 248/673 |
| 7,753,336 B2 * | 7/2010 | Hu | ................. | A47B 97/04 248/188.8 |
| 7,800,892 B2 * | 9/2010 | Gaskill | ................. | F16M 11/10 248/917 |
| 8,004,834 B2 * | 8/2011 | Shih | ................. | G06F 1/1632 361/679.55 |
| 8,100,376 B2 * | 1/2012 | Ye | ................. | A47B 23/043 248/454 |
| 8,464,995 B2 * | 6/2013 | Yang | ................. | F16M 11/10 248/454 |
| 9,198,507 B1 * | 12/2015 | Lau | ................. | A47B 97/08 |
| 9,408,317 B1 * | 8/2016 | Luo | ................. | F16M 11/00 |
| 9,578,979 B1 * | 2/2017 | Zeuch | ................. | A47G 1/164 |
| 9,637,031 B2 * | 5/2017 | Hill | ................. | A47C 7/383 |
| 9,689,524 B2 * | 6/2017 | Martin | ................. | G06F 1/1601 |
| 9,851,757 B2 * | 12/2017 | Tsuchihashi | ................. | G06F 1/1671 |
| 10,051,752 B1 * | 8/2018 | Meyers | ................. | F16M 11/38 |
| 10,226,130 B2 * | 3/2019 | Hill | ................. | B60N 2/882 |
| 2005/0139740 A1 * | 6/2005 | Chen | ................. | F16M 11/10 248/286.1 |
| 2007/0217135 A1 * | 9/2007 | Chuang | ................. | G06F 1/1626 361/679.05 |
| 2008/0283714 A1 * | 11/2008 | Behroozi | ................. | A47B 23/04 248/441.1 |
| 2010/0276560 A1 * | 11/2010 | Farris-Gilbert | ................. | F16M 13/00 248/346.3 |
| 2011/0038119 A1 * | 2/2011 | Yeh | ................. | G06F 1/1637 361/679.27 |
| 2012/0236527 A1 * | 9/2012 | Zhou | ................. | F16M 11/041 361/807 |
| 2013/0214661 A1 * | 8/2013 | McBroom | ................. | G06F 1/1667 312/325 |
| 2013/0232696 A1 * | 9/2013 | Halimi | ................. | A47C 16/00 5/640 |
| 2013/0242521 A1 * | 9/2013 | Lin | ................. | G06F 1/1624 361/807 |
| 2014/0092540 A1 * | 4/2014 | Hung | ................. | G06F 1/1601 361/679.05 |
| 2015/0103057 A1 * | 4/2015 | Lei | ................. | A47B 23/043 345/179 |
| 2015/0216064 A1 * | 7/2015 | Wu | ................. | F16M 11/10 248/346.3 |
| 2015/0282354 A1 * | 10/2015 | Spollen | ................. | A45C 11/00 206/45.2 |
| 2016/0088750 A1 * | 3/2016 | Wu | ................. | F16M 11/10 |
| 2016/0273702 A1 * | 9/2016 | Shiba | ................. | F16M 13/005 |
| 2018/0210494 A1 * | 7/2018 | Chen | ................. | G06F 1/1628 |
| 2019/0186683 A1 * | 6/2019 | Lo | ................. | F16M 13/005 |

* cited by examiner

SUPPORT FRAME FOR PORTABLE ELECTRONIC DEVICE

FIELD OF THE INVENTION

The present invention relates to a support frame, and more particularly to a support frame for a portable electronic device.

BACKGROUND OF THE INVENTION

With the explosion of modern information technology, many portable electronic devices are developed, such as smart phones, tablet computers, and notebook computers, so that people can easily receive or send messages anywhere, anytime. However, since these electronic devices are small in size and mostly in the form of a flat plate, it is difficult for the user to easily use the electronic devices when individually placed on a table top. The industry has developed a dedicated support frame to hold the electronic devices at an appropriate angle for use.

A conventional support frame, as disclosed in Taiwan Utility Model Publication No. M322011, includes two plates pivotally connected to each other. One of the plates is used to hold an electronic device and has several positioning slots, and the other plate is attached to a desktop. A positioning block is disposed between the two plates. After the two plates are opened, the positioning block is positioned in one of the positioning slots to retain a supporting angle. However, the number of supporting angles of the support frame is determined by the number of the positioning slots. Only a few positioning slots can be arranged on the plate of the support frame, so that the supporting angle of the support frame is limited, which is difficult to meet various environments when in use.

On the other hand, after the above-mentioned support frame is folded, the two plates are vertically stacked, so the overall height of the support frame is at least the sum of the heights of the two plates. The height of the support frame is too high, which does not conform to the trend of thinning of modern electronic products.

SUMMARY OF THE INVENTION

The primary object of the present invention is to provide a support frame for a portable electronic device. The support frame has two plates whose length is adjustable. By adjusting the length of the two plates to form a plurality of different supporting angles, the electronic device can be well supported in various environments.

In order to achieve the aforesaid object, the present invention provides a support frame for a portable electronic device. The support frame comprises a frame body, a first support arm, and a second support arm. The frame body is used for holding a portable electronic device thereon. An inner edge of the frame body defines a first side and a second side opposite to each other. The first support arm includes a first casing plate and a first inner plate. The first casing plate has a first hollow space therein. One end of the first casing plate is pivotally connected to the first side of the frame body. Another end of the first casing plate has a first opening. The first inner plate is movably accommodated in the first hollow space and extendable from the first opening. The first casing plate is provided with a first positioning member. The first inner plate is provided with a plurality of first positioning portions. Wherein, the first inner plate can be retained by positioning the first positioning member to one of the first positioning portions. The second support arm includes a second casing plate and a second inner plate. The second casing plate has a second hollow space therein. One end of the second casing plate is pivotally connected to the second side of the frame body. Another end of the second casing plate has a second opening. The second inner plate is movably accommodated in the second hollow space and extendable from the second opening and pivotally connected to the first inner plate. The second casing plate is provided with a second positioning member. The second inner plate is provided with a plurality of second positioning portions. Wherein, the second inner plate can be retained by positioning the second positioning member to one of the second positioning portions.

In an embodiment, the plurality of first positioning portions are spaced first engaging teeth. The first positioning member has elasticity and is normally engaged with one of the first engaging teeth. When the first positioning member is pressed, the first positioning member is deformed and disengaged from the corresponding one of the first engaging teeth to release a retaining state of the first casing plate and the first inner plate. The plurality of second positioning portions are spaced second engaging teeth. The second positioning member has elasticity and is normally engaged with one of the second engaging teeth. When the second positioning member is pressed, the second positioning member is deformed and disengaged from the corresponding one of the second engaging teeth to release a retaining state of the second casing plate and the second inner plate.

DETAILED DESCRIPTION OF THE PREFERRED EMBODIMENTS

Embodiments of the present invention will now be described, by way of example only, with reference to the accompanying drawings.

Figure 1:
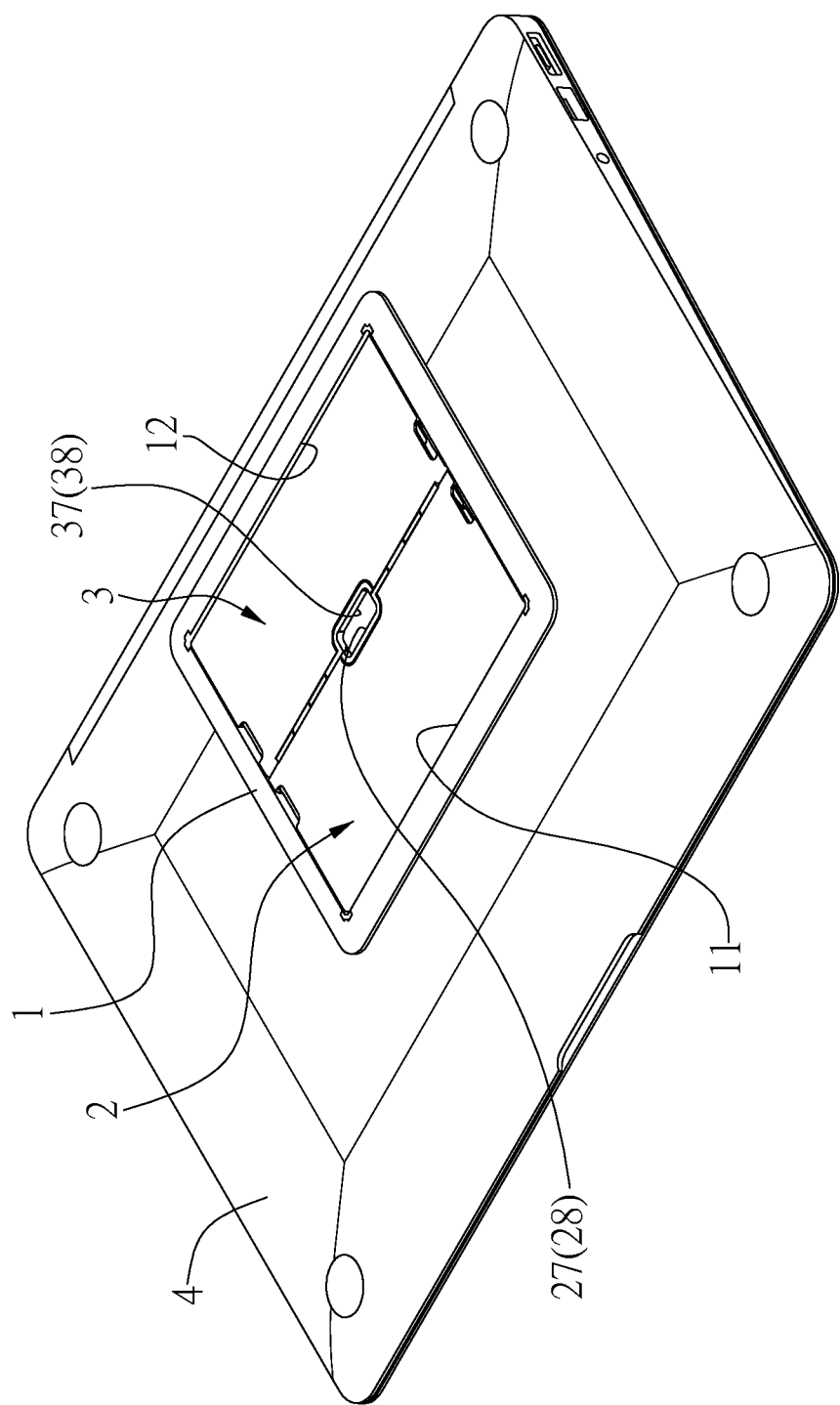
FIG. 1 is a perspective view in accordance with the present invention.
Figure 2:
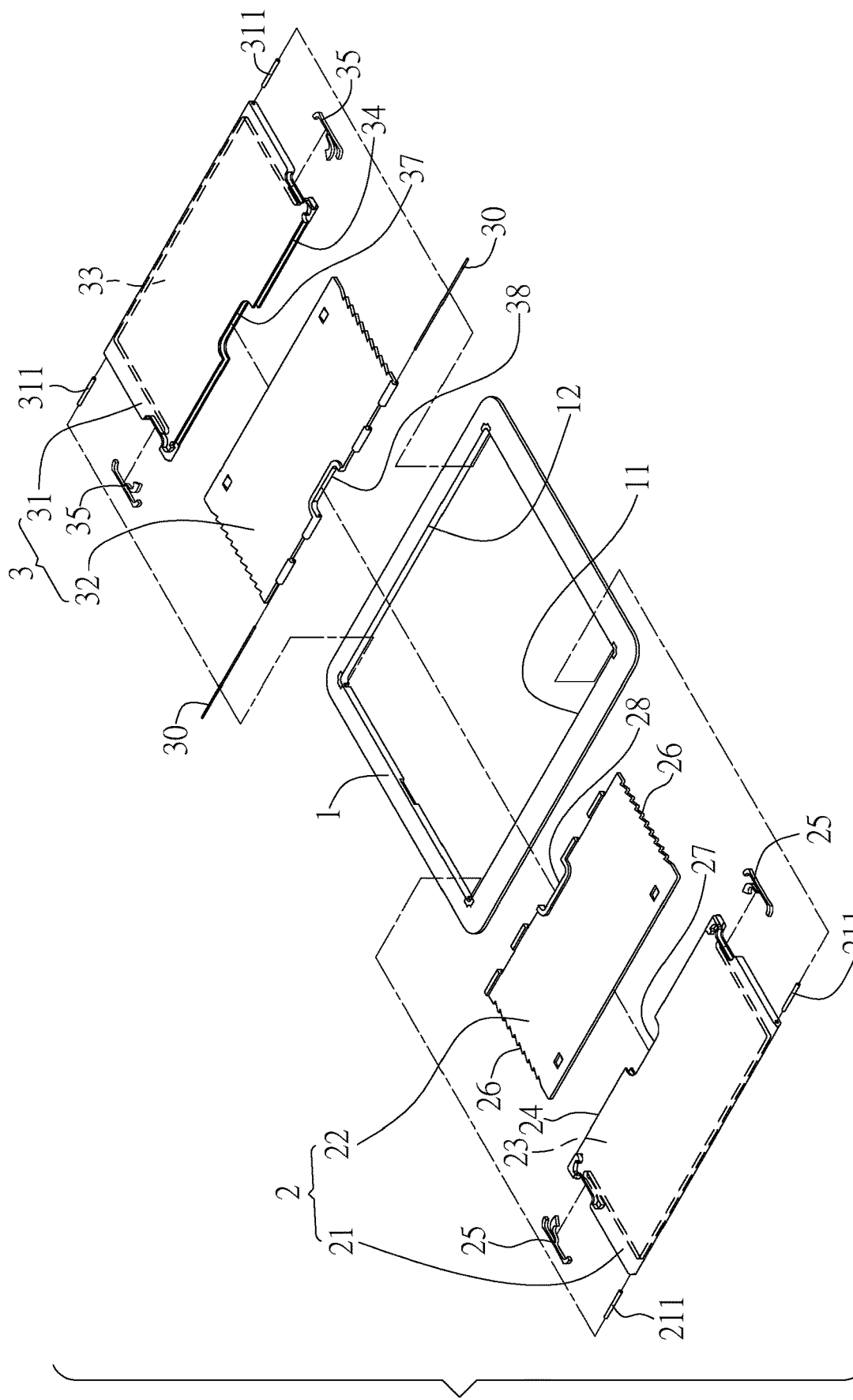
FIG. 2 is an exploded view in accordance with the present invention.
Figure 3:
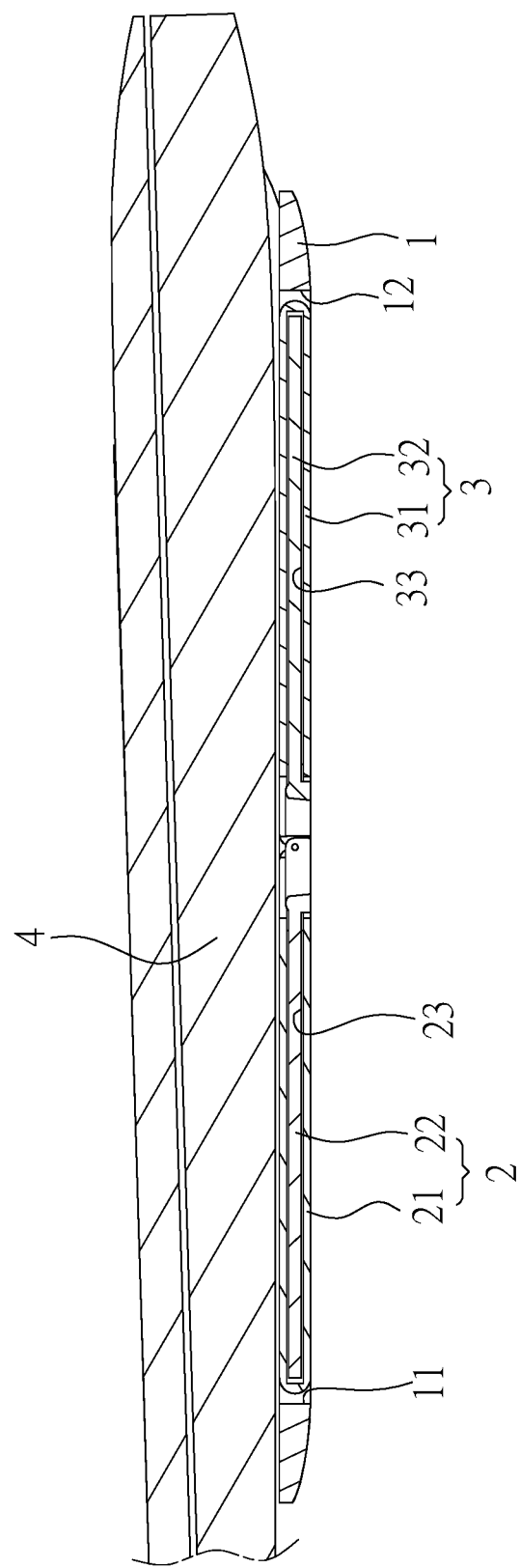
FIG. 3 is a sectional schematic view in accordance with the present invention.

Referring to FIG. 1 to FIG. 3, a support frame for a portable electronic device 4 in accordance with the present invention comprises a square frame body 1, a first support arm 2, and a second support arm 3. The lengths of the first support arm 2 and the second support arm 3 are adjustable. The portable electronic device 4, such as a smart phone, a tablet computer, a notebook computer, etc., can be held on the frame body 1. The inner edge of the frame body 1 defines a first side 11 and a second side 12 opposite to each other.

The first support arm 2 includes a first casing plate 21 and a first inner plate 22. The first casing plate 21 is in a hollow shape. The first casing plate 21 has a first hollow space 23 therein and a first opening 24 at one end thereof. The first casing plate 21 is pivotally connected to the first side 11 of the frame body 1 with a pivot shaft 211, so that the first casing plate 21 is pivotal relative to the frame body 1. The first inner plate 22 is accommodated in the first hollow space 23. One end of the first inner plate 22 extends out of the first opening 24. The first inner plate 22 can be pulled out from the first opening 24 and is movable relative to the first casing plate 21.

Figure 4:
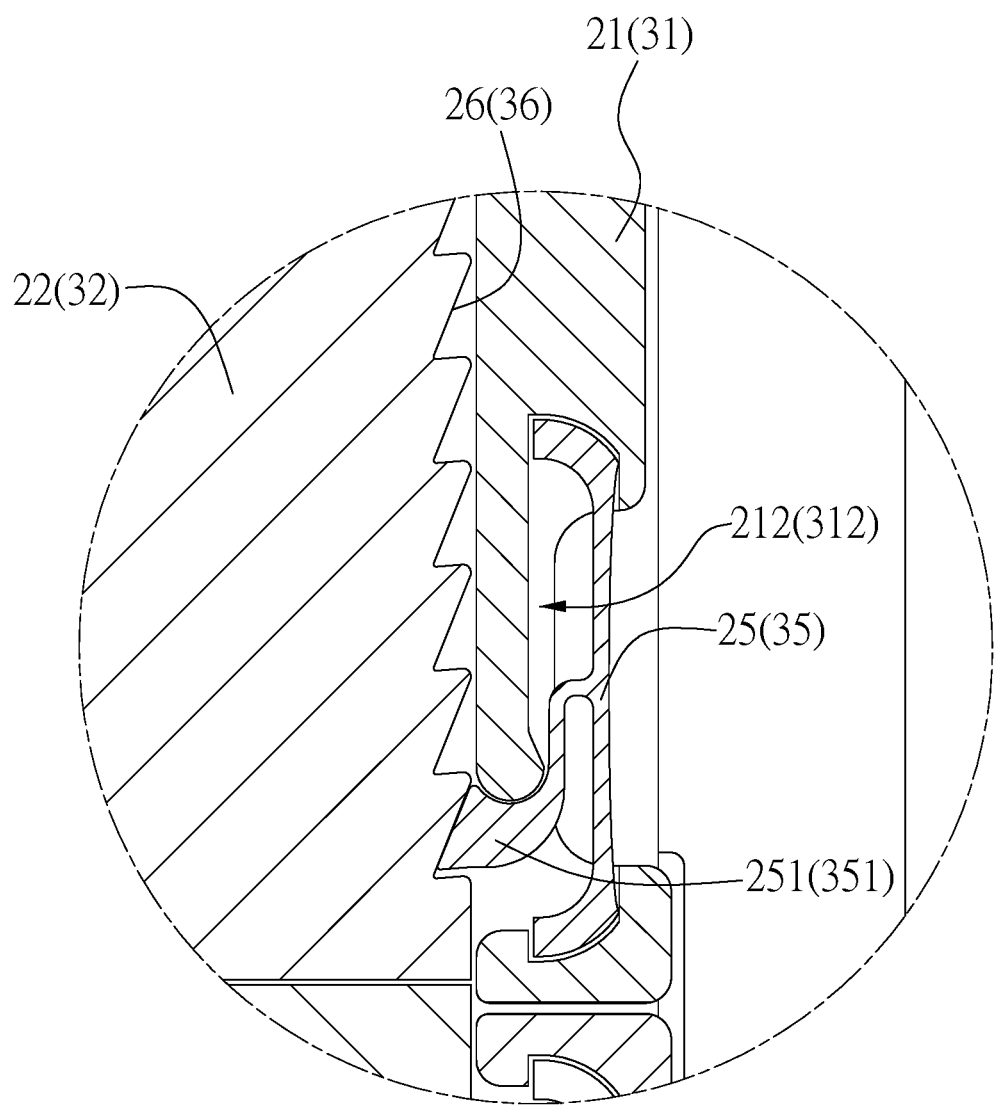
FIG. 4 and FIG. 5 are schematic views of the operating state of the positioning member in accordance with the present invention.
Figure 5:
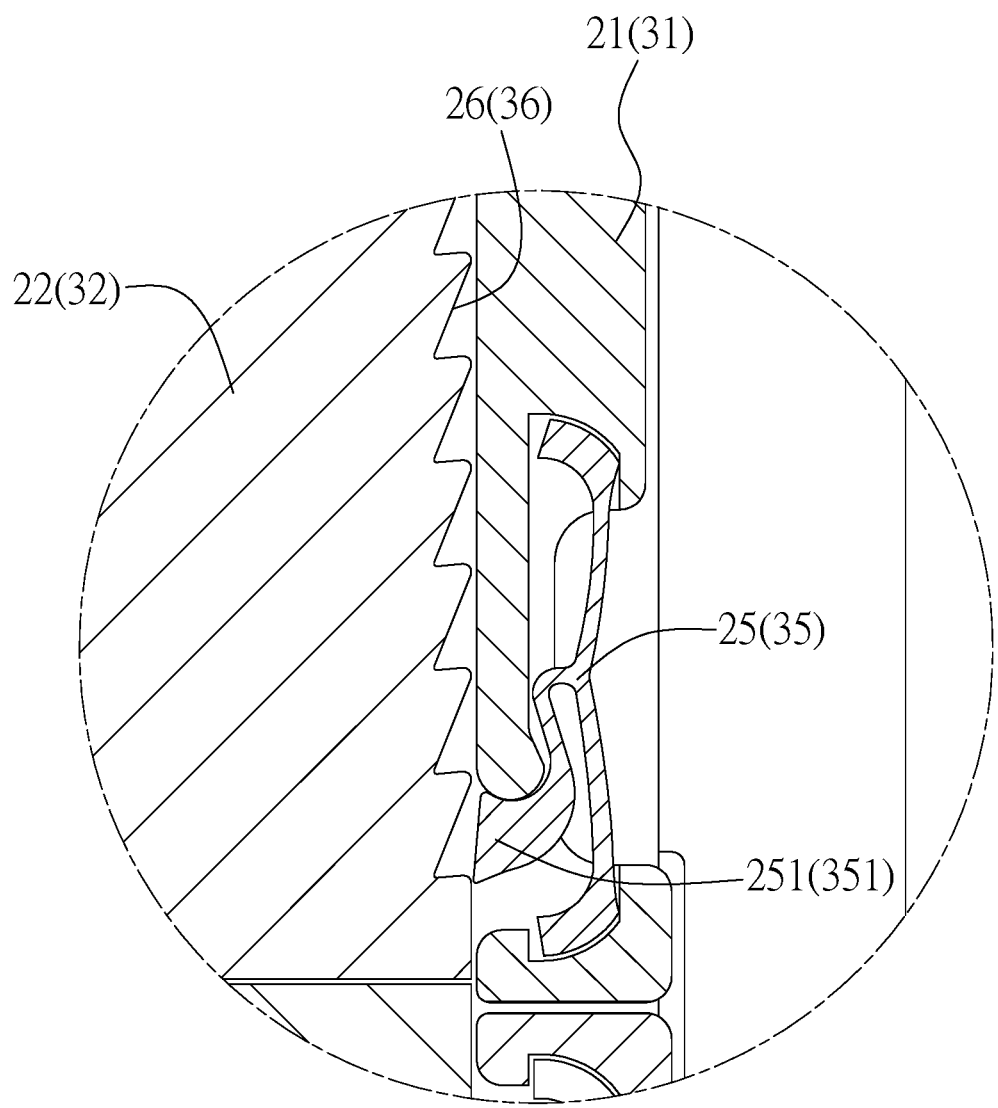

The first casing plate 21 and the first inner plate 22 have a relatively retaining structure. Two sides of the first inner plate 22 are provided with a plurality of first positioning portions, respectively. Each of two sides of the first casing plate 21 is provided with a first positioning member 25 corresponding to the first positioning portions. The first inner plate 22 can be retained by positioning the first positioning member 25 to one of the first positioning portions. In this embodiment, as shown in FIG. 4, the plurality of first positioning portions are spaced first engaging teeth 26. The first positioning member 25 is accommodated in a first accommodating room 212 of the first casing plate 21 and has a first engaging portion 251 extending toward the first engaging teeth 26. The first positioning member 25 has elasticity. The first engaging portion 251 is normally engaged with one of the first engaging teeth 26, so that the first casing plate 21 and the first inner plate 22 are relatively retained. When the first positioning member 25 is pressed, as shown in FIG. 5, the first positioning member 25 is deformed and disengaged from the first engaging teeth 26 to release the retaining state of the first casing plate 21 and the first inner plate 22. Accordingly, the length of the first support arm 2 can be adjusted by changing of the relative position of the first casing plate 21 and the first inner plate 22.

As shown in FIG. 1 to FIG. 3, the second support arm 3 includes a second casing plate 31 and a second inner plate 32. The second casing plate 31 is in a hollow shape. The second casing plate 31 has a second hollow space 33 therein and a second opening 34 at one end thereof. The second casing plate 31 is pivotally connected to the second side 12 of the frame body 1 with a pivot shaft 311, so that the second casing plate 31 is pivotal relative to the frame body 1. The second inner plate 32 is accommodated in the second hollow space 33. One end of the second inner plate 32 extends out of the second opening 34 and is pivotally connected to the first inner plate 22 through a pivot shaft 30. The second inner plate 32 can be pulled out from the second opening 34 and is movable relative to the second casing plate 31.

The second casing plate 31 and the second inner plate 32 have a relatively retaining structure. Two sides of the second inner plate 32 are provided with a plurality of second positioning portions, respectively. Each of two sides of the second casing plate 31 is provided with a second positioning member 35 corresponding to the second positioning portions. The second inner plate 32 can be retained by positioning the second positioning member 35 to one of the second positioning portions. In this embodiment, as shown in FIG. 4, the plurality of second positioning portions are spaced second engaging teeth 36. The second positioning member 35 is accommodated in a second accommodating room 312 of the second casing plate 31 and has a second engaging portion 351 extending toward the second engaging teeth 36. The second positioning member 35 has elasticity. The second engaging portion 351 is normally engaged with one of the second engaging teeth 36, so that the second casing plate 31 and the second inner plate 32 are relatively retained. When the second positioning member 35 is pressed, as shown in FIG. 5, the second positioning member 35 is deformed and disengaged from the second engaging teeth 36 to release the retaining state of the second casing plate 31 and the second inner plate 32. Accordingly, the length of the second support arm 3 can be adjusted by changing the relative position of the second casing plate 31 and the second inner plate 32.

Figure 6:
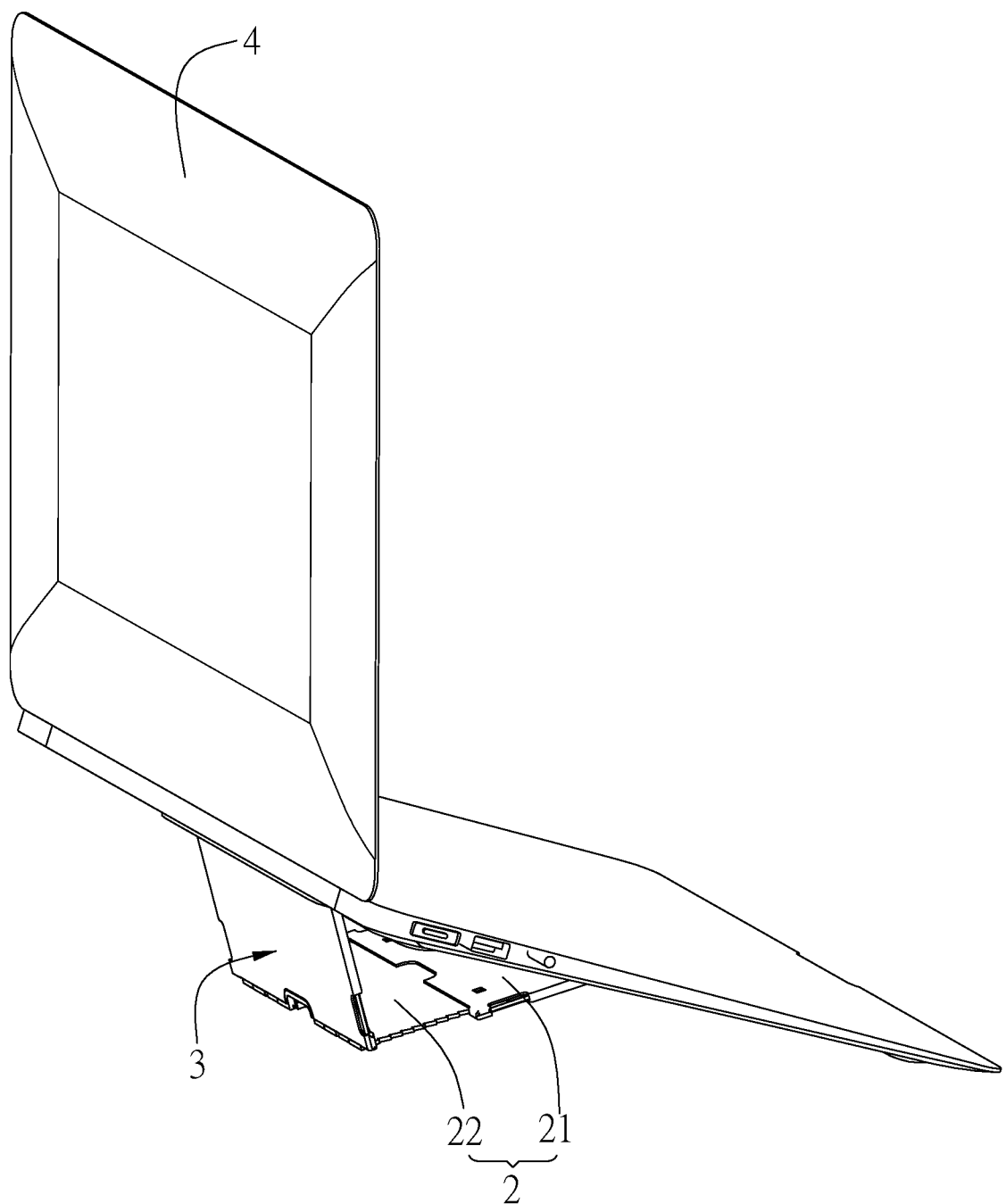
FIG. 6 and FIG. 7 are schematic views in accordance with the present invention when in use.
Figure 7:
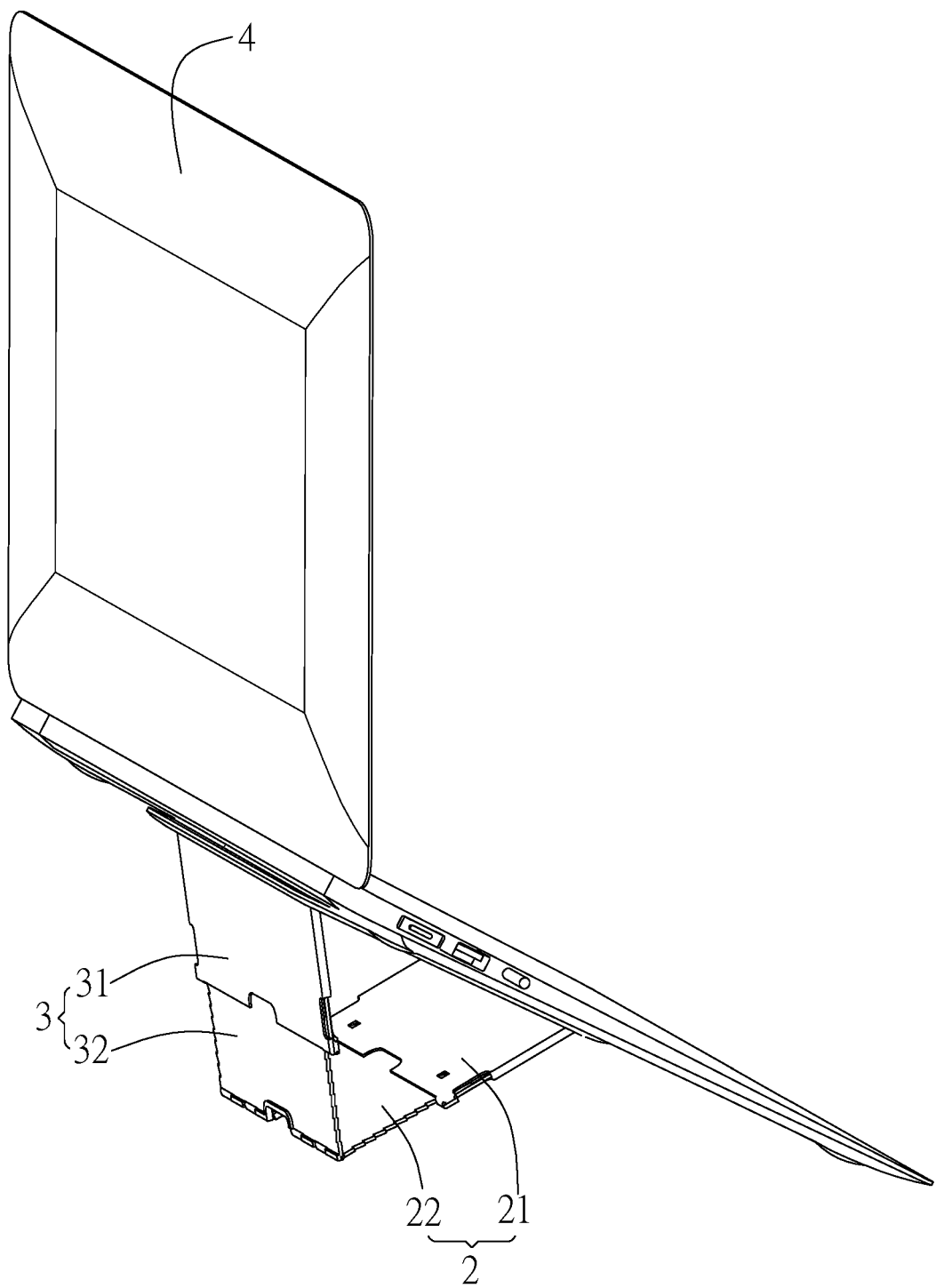

With the above structure, the present invention can change the angle of supporting the electronic device 4 by adjusting the length of the first support arm 2 or the second support arm 3. In detail, when the first casing plate 21 and the second casing plate 31 are pivoted and opened relative to the frame body 1, the corresponding inner plate can be pulled out from the first casing plate 21 or the second casing plate 31 to adjust the length of the first support arm 2 or the second support arm 3. For example, as shown in FIG. 6, only the first inner plate 22 is pulled out from the first casing plate 21. As shown in FIG. 7, the first inner plate 22 and the second inner plate 32 are pulled out from the first casing plate 21 and the second casing plate 31, respectively. Accordingly, the included angle between the first support arm 2 and the second support arm 3 can be changed, and thus the angle of supporting the electronic device 4 is changed.

Furthermore, as shown in FIG. 1 and FIG. 2, the first casing plate 21, the second casing plate 31, the first inner plate 22 and the second inner plate 32 are provided with recessed control portions 27, 28, 37, 38 respectively to facilitate the operation control.

The advantage of the present invention is that the first support arm 2 and the second support arm 3 can use the multiple positioning portions thereof to achieve multi-stage length adjustment, so that the supporting angle can be changed for different environments when in use. On the other hand, the means for adjusting the length of the first support arm 2 and the second support arm 3 is that the inner plates 22, 32 are received in the casing plates 21, 31, so that the overall height of the support frame is not affected, meeting the trend of thinning of electronic devices.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A support frame for a portable electronic device, comprising:

a frame body, used for holding the portable electronic device thereon; an inner edge of the frame body defining a first side and a second side opposite to each other;

a first support arm, including a first casing plate and a first inner plate; the first casing plate having a first hollow space therein, one end of the first casing plate being pivotally connected to the first side of the frame body, another end of the first casing plate having a first opening; the first inner plate being movably accommodated in the first hollow space and extendable from the first opening; the first casing plate being provided with a first positioning member, the first inner plate being provided with a plurality of first positioning portions, wherein the first inner plate can be retained by positioning the first positioning member to one of the first positioning portions; and a second support arm, including a second casing plate and a second inner plate; the second casing plate having a second hollow space therein, one end of the second casing plate being pivotally connected to the second side of the frame body, another end of the second casing plate having a second opening; the second inner plate being movably accommodated in the second hollow space and extendable from the second opening and pivotally connected to the first inner plate; the second casing plate being provided with a second positioning member, the second inner plate being provided with a plurality of second positioning portions, wherein the second inner plate can be retained by positioning the second positioning member to one of the second positioning portions.

2. The support frame as claimed in claim 1, wherein the plurality of first positioning portions are spaced first engaging teeth, the first positioning member has elasticity and is normally engaged with one of the first engaging teeth, when the first positioning member is pressed, the first positioning member is deformed and disengaged from the corresponding one of the first engaging teeth to release a retaining state of the first casing plate and the first inner plate; the plurality of second positioning portions are spaced second engaging teeth, the second positioning member has elasticity and is normally engaged with one of the second engaging teeth, when the second positioning member is pressed, the second positioning member is deformed and disengaged from the corresponding one of the second engaging teeth to release a retaining state of the second casing plate and the second inner plate.

3. The support frame as claimed in claim 1, wherein the first casing plate, the second casing plate, the first inner plate and the second inner plate are provided with control portions, respectively.

* * * * *